(12) United States Patent
Stuermann et al.

(10) Patent No.: US 7,798,008 B2
(45) Date of Patent: Sep. 21, 2010

(54) PRESSURE SENSOR MODULE AND METHOD FOR MANUFACTURING THE SAME

(75) Inventors: Joerg Stuermann, Bremen (DE); Thomas Niemann, Delmenhorst (DE)

(73) Assignee: Hella KGaA Hueck & Co., Lippstadt (DE)

( * ) Notice: Subject to any disclaimer, the term of this patent is extended or adjusted under 35 U.S.C. 154(b) by 0 days.

(21) Appl. No.: 12/384,642

(22) Filed: Apr. 7, 2009

(65) Prior Publication Data

US 2009/0255344 A1 Oct. 15, 2009

(30) Foreign Application Priority Data

Apr. 9, 2008 (DE) ............... 10 2008 017 871

(51) Int. Cl.
*G01L 9/00* (2006.01)
(52) U.S. Cl. ..................................... 73/754
(58) Field of Classification Search .............. 73/754, 73/753, 756, 708; 439/76.1
See application file for complete search history.

(56) References Cited

U.S. PATENT DOCUMENTS

| 5,897,338 | A | 4/1999 | Kaldenberg |
| 5,993,223 | A * | 11/1999 | Rehhoff ............... 439/76.1 |
| 6,155,119 | A | 12/2000 | Normann et al. |
| 6,300,169 | B1 | 10/2001 | Weiblen et al. |
| 6,311,561 | B1 * | 11/2001 | Bang et al. ............ 73/708 |
| 6,351,390 | B1 | 2/2002 | Mayer et al. |
| 6,871,546 | B2 | 3/2005 | Scheurich et al. |
| 7,055,339 | B2 | 6/2006 | Hebert |
| 7,363,819 | B2 * | 4/2008 | Mast et al. ............ 73/754 |
| 2005/0186703 | A1 | 8/2005 | Weiblen et al. |

FOREIGN PATENT DOCUMENTS

| DE | 196 05 795 | 8/1997 |
| DE | 199 29 026 | 12/2000 |
| DE | 101 44 461 | 4/2002 |
| DE | 10 2004 003 | 8/2005 |
| EP | 0 946 861 | 10/1999 |

OTHER PUBLICATIONS

English translation of German Search Report dated Feb. 25, 2009.

* cited by examiner

*Primary Examiner*—Jewel Thompson
(74) *Attorney, Agent, or Firm*—Collard & Roe, P.C.

(57) ABSTRACT

For a pressure sensor module comprising a printed circuit board and a pressure cell, wherein the pressure cell has a measuring opening, and the pressure cell is encapsulated by injection molding compound in such a manner that the measuring opening is kept open, the pressure cell, as viewed from the measuring opening, is attached on the rear side of the printed circuit board. The printed circuit board has a recess in the area of the measuring opening, and the injection molding compound encloses the attachment area of the pressure cell on the printed circuit board. Thereby, the use of different adhesives, also soft adhesives, for the connection of the pressure cell with the printed circuit board is possible without this attachment area being attacked by the surrounding media.

9 Claims, 2 Drawing Sheets

PRESSURE SENSOR MODULE AND METHOD FOR MANUFACTURING THE SAME

CROSS REFERENCE TO RELATED APPLICATIONS

Applicants claim priority under 35 U.S.C. §119 of German Application No. 10 2008 017 871.3 filed Apr. 9, 2008.

BACKGROUND OF THE INVENTION

1. Field of the Invention

The invention relates to a pressure sensor module comprising a printed circuit board and a pressure cell, wherein the pressure cell has a measuring opening, and the pressure cell is encapsulated by injection molding compound in such a manner that a measuring opening of the pressure cell is open. Furthermore, the invention relates to a method for manufacturing such a pressure sensor module.

2. The Prior Art

A pressure sensor module of the above mentioned type is known, for example, from DE 199 29 026 A1. Here, a pressure cell, namely a semiconductor pressure sensing element, is placed onto an assembly segment of a lead grid and is electrically contacted. In an injection molding die, a housing is made of injection molding compound, wherein a measuring opening is left free for pressure feed to the pressure cell.

Other such pressure sensor modules are known from the publications U.S. Pat. No. 5,897,338, U.S. Pat. No. 6,871,546 B2, and U.S. Pat. No. 7,055,339 B2. Reference is made to their descriptions of the prior art of pressure sensor modules and to the manufacturing methods.

SUMMARY OF THE INVENTION

The invention is based on the object to provide a pressure sensor module and a method for its manufacturing by means of which a pressure sensor module is provided which can be manufactured in a simple manner and which, at the same time, is particularly durable, in particular in the area of the connection of the pressure cell.

The solution of this object is realized with a pressure sensor module with the features of the patent claim 1. With respect to the method, the solution of the object is realized with the features of the patent claim 8. Advantageous developments of the invention are described in the sub-claims.

For a pressure sensor module comprising a printed circuit board and a pressure cell, wherein the pressure cell has a measuring opening, and the pressure cell is encapsulated by injection molding compound in such a manner that the measuring opening is kept open, it is essential for the invention that the pressure cell, as viewed from the measuring opening, is attached on the rear side of the printed circuit board, that the printed circuit board has a recess in the area of the measuring opening, and that the attachment area of the pressure cell on the printed circuit board is covered by the injection molding compound. Thereby, it is ensured that the attachment area does not come in contact with the surrounding medium. In particular in case of aggressive media, the connection between pressure cell and printed circuit board is otherwise subject to severe requirements and is potentially destroyed or affected by the medium. By means of the design according to the invention, specifically the attachment area is protected against the medium.

The pressure cell is preferably a piezo-resistive, micromechanical sensor. In a preferred design, the pressure cell is glued to the printed circuit board. By means of the design according to the invention, the selection of adhesive is considerably increased. Preferably, thereby, the use of soft glues or adhesives is possible. In addition, in this respect, this is of advantage since, by means of hard or rigid adhesives, the mechanical stress is transferred into the pressure membrane.

Preferably, for this, the injection molding compound is directly in contact with the pressure cell, at least in certain areas, thereby sealing the connection between pressure cell and printed circuit board. For this purpose, the lower side of the oil pressure sensor is preferably made of Pyrex or silicon. The injection molding compound or mold compound seals thereon. Thereby, it is prevented that the medium to be measured, for example oil, comes in direct contact with the silicone adhesive for the pressure cell.

The recess in the printed circuit board in the area of the pressure cell is advantageously bigger than the measuring opening. In this manner, there is sufficient space available so that the molding compound can join directly at the pressure cell. In a preferred embodiment, in the area of the pressure cell, the diameter of the recess of the printed circuit board is at least double the size of the diameter of the measuring opening of the pressure cell. The measuring opening formed within the injection molding compound is preferably formed funnel-shaped. Such a measuring opening is particularly simple to produce. In a preferred application, the pressure sensor module is arranged within a motor vehicle, in particular in the area of the engine oil.

In the method for manufacturing an above described pressure sensor module in which, prior to the encapsulation with injection molding compound, a stamp is placed onto the area to be kept free, it is provided according to the invention that the stamp rests directly on the pressure cell, wherein the stamp is dimensioned and positioned in such a manner that around the area on the pressure cell covered by the stamp, a free area remains on the pressure cell, on which area injection molding compound is applied in the subsequent step. By means of this method, the pressure sensor according to the invention can be manufactured in a simple manner and, in particular, the attachment areas, in particular the bonding area of the pressure cell on the printed circuit board, are encapsulated with injection molding compound and are protected against contact with the medium.

BRIEF DESCRIPTION OF THE DRAWINGS

Below, the invention is further described by means of an exemplary embodiment shown in the drawing. Schematically, in the individual figures.

DETAILED DESCRIPTION OF PREFERRED EMBODIMENTS

Figure 1:
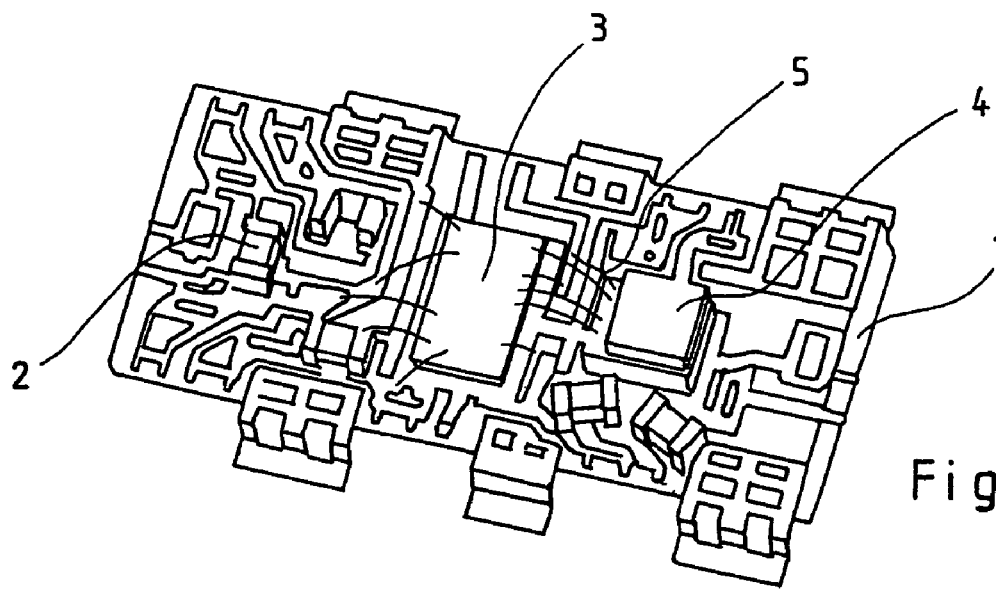
FIG. 1 shows a printed circuit board with a pressure cell in a top view.

In FIG. 1, a printed circuit board 1 or lead frame is shown, on which a plurality of semiconductor components 2, a microprocessor 3, and, in addition, a pressure cell 4 is shown. The pressure cell 4 is connected with the microprocessor 3 and paths of the printed circuit board 1 by means of bonding wires 5.

Figure 2:
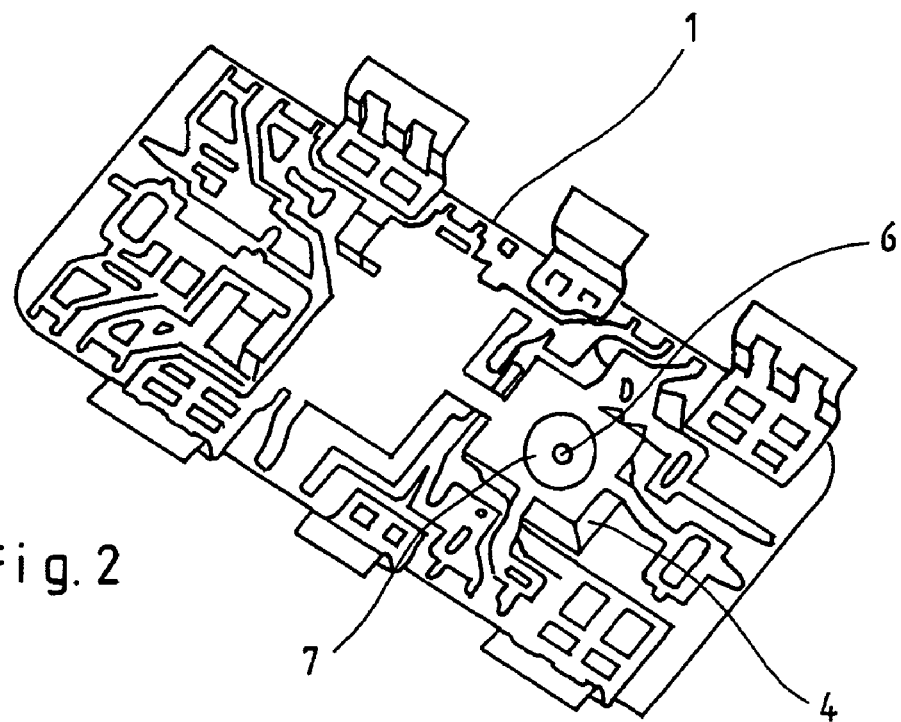
FIG. 2 shows a printed circuit board with a pressure cell in a bottom view.
Figure 3:
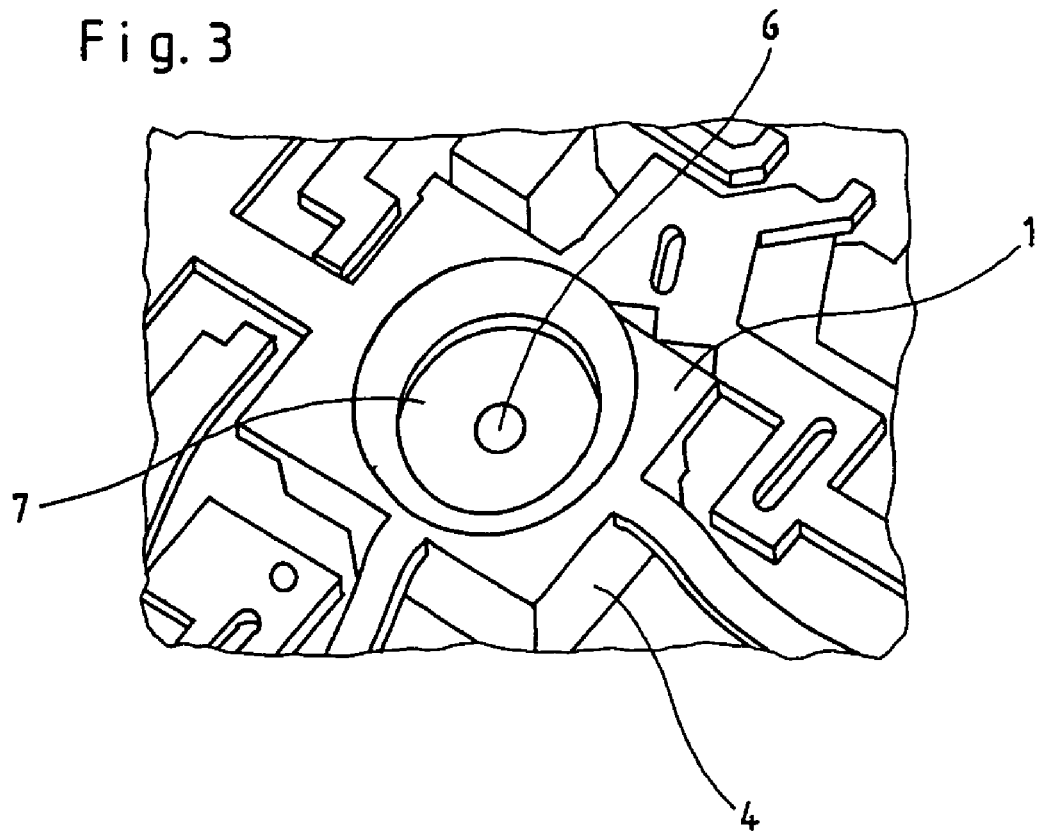
FIG. 3 shows an enlarged cut-out according to FIG. 2.

In FIG. 2, the lower side of the printed circuit board 1 with the pressure cell 4 is shown. The pressure cell 4 is a piezo-resistive, micromechanical pressure sensor which, on the rear side, has an open window which is denoted here as measuring opening 6. The measuring opening 6 within the pressure cell 4 itself is also denoted here with 6. Before injection-molding around the printed circuit board 1, a stamp is inserted into the opening 7 of the printed circuit board 1 so that this area is kept free during injection-molding around the lead frame. Since the stamp 4 abuts against the pressure cell 4, and the injection molding compound or mold compound seals directly at the pressure cell 4, the bonding surface between pressure cell 4 and printed circuit board 1 is protected against the medium. In FIG. 3, an enlarged cut-out according to FIG. 2 is shown. The same parts are denoted with the same reference numbers.

Figure 4:
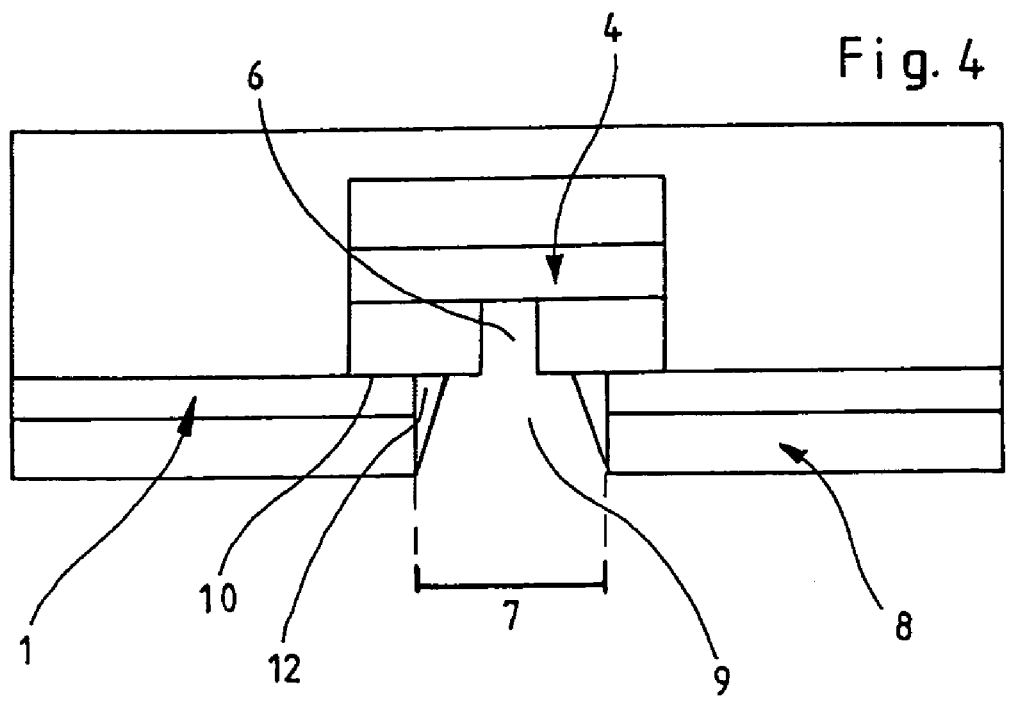
FIG. 4 shows a cross-section of the printed circuit board in the area of the pressure cell with injection molding compound.

In FIG. 4, a schematic cross-section of the area according to FIG. 3 after the encapsulation with injection molding compound is shown. As viewed from the measuring direction 11 or pressure direction through the measuring opening 6, the pressure cell 4 is arranged behind the printed circuit board 1. In the connection areas 10 between the printed circuit board 1 and the pressure cell, the pressure cell is glued to the printed circuit board. Here, the injection molding compound 8 is shown, thus, the state after overmolding is shown. Here, it is clearly recognizable that the injection molding compound 8, in the area of the recess 7 of the printed circuit board 1, joins directly at the pressure cell 4. This point is denoted with the reference number 12. By means of this attachment of the injection molding compound 8, which hence encloses also the connection area 10 between the printed circuit board and the pressure cell, it is ensured that the medium does not penetrate to this connection area 10. The measuring opening expands outwards into a funnel-shaped area 9, in which, during the manufacturing process, a stamp is positioned, which keeps this area free during injection-molding. Thus, the stamp abuts directly on the surface of the pressure cell 4 and keeps the measuring opening 6, 9 free. After overmolding, the stamp is removed.

The invention claimed is:

1. A pressure sensor module comprising a printed circuit board (1) and a pressure cell (4), wherein the pressure cell (4) has a measuring opening (6) and the pressure cell (4) is encapsulated with injection molding compound (8) in such a manner that the measuring opening (6) of the pressure cell (4) is left open,
    wherein the pressure cell (4), as viewed from the measuring direction (11), is attached on the rear side of the printed circuit board (1),
    wherein the printed circuit board (1) has a recess (7) in the area of the measuring opening (6), and
    wherein the injection molding compound (8) encloses the attachment area (10) of the pressure cell (4) on the printed circuit board (1).

2. The pressure sensor module according to claim 1, wherein the pressure cell (4) is glued to the printed circuit board (1).

3. The pressure sensor module according to claim 1, wherein the printed circuit board (1) has a recess (7) in the area of the pressure cell (4) which is bigger than the measuring opening (6) of the pressure cell (4).

4. The pressure sensor module according to claim 1, wherein the printed circuit board (1) has a recess (7) in the area of the pressure cell (4), the diameter of which recess is at least double the size of the diameter of the measuring opening (6) of the pressure cell (4).

5. The pressure sensor module according to claim 1, wherein the injection molding compound (8) is directly injection-molded on the pressure cell (4).

6. The pressure sensor module according to claim 1, wherein the portion (9) of the measuring opening (6) formed in the injection molding compound (8) is formed funnel-shaped.

7. A pressure sensor module comprising a printed circuit board (1) and a pressure cell (4), wherein the pressure cell (4) has a measuring opening (6) and the pressure cell (4) is encapsulated with injection molding compound (8) in such a manner that the measuring opening (6) of the pressure cell (4) is left open,
    wherein the pressure cell (4), as viewed from the measuring direction (11), is attached on the rear side of the printed circuit board (1),
    wherein the printed circuit board (1) has a recess (7) in the area of the pressure cell (4), the diameter of which recess is at least double the size of the diameter of the measuring opening (6) of the pressure cell (4), and
    wherein the injection molding compound (8) encloses the attachment area (10) of the pressure cell (4) on the printed circuit board (1).

8. A motor vehicle comprising a pressure sensor module according to claim 1.

9. A method for manufacturing a pressure sensor module according to claim 1, in which before the encapsulation with injection molding compound, a stamp is placed on the area to be kept free,
    wherein the stamp is placed directly onto the pressure cell, wherein the stamp is dimensioned and positioned in such a manner that around the area on the pressure cell covered by the stamp, a free area remains on the pressure cell, to which area, injection molding compound is applied in the subsequent step.

* * * * *